(12) United States Patent
Li et al.

(10) Patent No.: US 8,797,249 B2
(45) Date of Patent: Aug. 5, 2014

(54) THIN-FILM TRANSISTOR (TFT) ARRAY STRUCTURE AND LIQUID CRYSTAL DISPLAY (LCD) PANEL THEREOF

(75) Inventors: Shiqi Li, Guangdong (CN); Jiali Jiang, Guangdong (CN); Haiying He, Guangdong (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 0 days.

(21) Appl. No.: 13/203,753

(22) PCT Filed: Jun. 20, 2011

(86) PCT No.: PCT/CN2011/075956
§ 371 (c)(1),
(2), (4) Date: Aug. 29, 2011

(87) PCT Pub. No.: WO2012/167451
PCT Pub. Date: Dec. 13, 2012

(65) Prior Publication Data
US 2014/0092333 A1 Apr. 3, 2014

(30) Foreign Application Priority Data
Jun. 8, 2011 (CN) .......................... 2011 1 0152580

(51) Int. Cl.
G09G 3/36 (2006.01)
G02F 1/1362 (2006.01)
H01L 27/12 (2006.01)
G02F 1/1368 (2006.01)
G02F 1/133 (2006.01)
H01L 29/786 (2006.01)

(52) U.S. Cl.
CPC ........ G02F 1/136213 (2013.01); G02F 1/1362 (2013.01); H01L 27/12 (2013.01); G02F 1/1368 (2013.01); G02F 1/133 (2013.01); H01L 29/786 (2013.01)

USPC ........................................................ 345/92

(58) Field of Classification Search
CPC combination set(s) only.
See application file for complete search history.

(56) References Cited

U.S. PATENT DOCUMENTS

| 2009/0027581 A1* | 1/2009 | You et al. | 349/48 |
| 2009/0102752 A1* | 4/2009 | Honda | 345/55 |
| 2010/0157185 A1* | 6/2010 | Kim et al. | 349/38 |
| 2010/0259519 A1 | 10/2010 | Chen et al. | |
| 2012/0182489 A1* | 7/2012 | Wang et al. | 349/38 |

FOREIGN PATENT DOCUMENTS

| CN | 201072484 Y | 6/2008 |
| CN | 101446722 A | 6/2009 |
| CN | 101598879 A | 12/2009 |
| CN | 101697055 A | 4/2010 |
| CN | 101866087 A | 10/2010 |

* cited by examiner

Primary Examiner — William Boddie
Assistant Examiner — Bryan Earles
(74) Attorney, Agent, or Firm — Mark M. Friedman

(57) ABSTRACT

A thin-film transistor (TFT) array structure and a liquid crystal display (LCD) panel thereof are described. The TFT array structure includes a plurality of scan lines, a plurality of first data lines, a plurality of second data lines, a plurality of pixel units and a plurality of control module. Each of the control modules is coupled among the scan line, one second data line and one pixel unit. The second data line charges the later control module when the scan line is selected to be activated for charging the pixel unit by the first data line. The charged later control module charges another pixel unit when the scan line is inactivated and another scan line is selected to be activated for charging another pixel unit by the first data line. The TFT array structure can reduce the charging duration of the pixels.

10 Claims, 3 Drawing Sheets

US 8,797,249 B2

THIN-FILM TRANSISTOR (TFT) ARRAY STRUCTURE AND LIQUID CRYSTAL DISPLAY (LCD) PANEL THEREOF

FIELD OF THE INVENTION

The present invention relates to a transistor array and display panel thereof, and more particularly to a thin-film transistor (TFT) array structure and a liquid crystal display (LCD) panel thereof.

BACKGROUND OF THE INVENTION

A TFT array is a key component of the liquid crystal display (LCD). FIG. 1 is a schematic structural view of a conventional TFT array 100. The TFT array 100 includes a plurality of pixel units 102, a plurality of scan lines 104 and a plurality of data lines 106.

The pixel units 102 are electrically connected to the scan lines 104 and the data lines 106. Each of the pixel units 102 has a transistor 108, a liquid-crystal capacitor (CLC) 110 and a storage capacitor (CS) 112 wherein the transistor 108 has a gate electrode G, a source electrode S and a drain electrode D. The gate electrode G is connected to the scan line 104, the source electrode S is connected to the data line 106, and the drain electrode D is commonly connected to the CLC 110 and the CS 112 (as shown in FIG. 1) or commonly connected to the common line (not shown).

When a positive voltage is applied to the first scan line (SL1), the thin transistor 108 connected to the first scan line (SL1) turns on so that the pixel electrodes of the CLC 110 are electrically connected to the data lines 106 and the video signal is transmitted to the pixel electrode of pixel unit via the data lines 106 correspondingly for charging the CLC 110 to be a proper voltage level. In other words, the CLC 110 of the pixel unit 102 is charged to drive the liquid crystal molecules within the liquid crystal layer for displaying the image on the LCD panel. Meanwhile, the CSs 112 connected to the data lines 106 are charged wherein the charged CSs 112 are used to maintain the voltage potential of the CLC 110 to be a predetermined value for keeping the voltage potential to be constant in the both terminals of the CLC 110 by the charged CSs 112 before the data lines are updated. Afterwards, a negative voltage is applied to the thin transistor 108 to turn off the thin transistor 108 until the video signal is written to the vertical data lines 106 next time wherein the charges is stored in the CLC 110. The next scan line (SL2) 104 is activated and the video signal is transmitted to the pixel electrodes of the pixel unit P2 102 via the data lines 106 correspondingly.

However, it is required to turn off the thin transistor 108 connected to the scan line (SL1) before the CLC 110 and the CS 112 of the pixel unit P2 102 on the scan line (SL2) are charged, which results in a lot of charging duration. Consequently, there is a need to develop a novel TFT array structure to solve the aforementioned problem of the long charging duration.

SUMMARY OF THE INVENTION

One objective of the present invention is to provide a thin-film transistor (TFT) array structure and a liquid crystal display (LCD) panel thereof to solve the aforementioned problem of the long charging duration. In the TFT array, the capacitor is charged in advance to reduce the charging duration of the pixel units.

According to the above objective, the present invention sets forth a TFT array structure and a LCD panel thereof. The TFT array structure includes a plurality of scan lines, a plurality of first data lines, a plurality of second data lines, a plurality of pixel units and a plurality of control module. The first data lines are disposed and interlaced with the scan lines. The second data lines are disposed and interlaced with the scan lines. Each of the pixel units is coupled to one scan line and one first data line respectively. Each of the control modules is coupled among the scan line, one second data line and one pixel unit. The second data line charges the later control module when the scan line is selected to be activated for charging the pixel unit by the first data line. The charged later control module charges another pixel unit when the scan line is inactivated and another scan line is selected to be activated for charging another pixel unit by the first data line.

In one embodiment, the later control module further includes a first control transistor, a second control transistor and a capacitor. The first control transistor is coupled to the scan line, the second data line, the pixel unit and a former control module corresponding to the later control module. The second control transistor is coupled to another scan line and another pixel unit. The capacitor is coupled to the first control transistor and the second control transistor of the later control module.

In one embodiment, the second data line and the first control transistor charge the capacitor of the later control module when the scan line is selected to be activated for charging the pixel unit by the first data line. The charged capacitor of the later control module charges another pixel unit when the scan line is inactivated and another scan line is selected to be activated for charging another pixel unit by the first data line.

In one embodiment, the former control module further includes a first control transistor, a second control transistor and a capacitor. The second control transistor is coupled to the scan line, the pixel unit and the gate electrode of the first control transistor in the later control module. The capacitor is coupled to the second control transistor.

In one embodiment, the pixel unit further includes a switching transistor, a liquid-crystal capacitor and a storage capacitor. The switching transistor is coupled to the scan line, the first data line, the second control transistor of the former control module, and the gate electrode of the first control transistor of the later control module. The liquid-crystal capacitor is coupled to the switching transistor. The storage capacitor is coupled to the switching transistor and connected to the liquid-crystal capacitor in parallel manner.

In another embodiment, the LCD panel has a scan driving module, a data driving module, and a TFT array structure wherein the scan driving module and the data driving module are used to drive the TFT array structure. The TFT array structure includes a plurality of scan lines, a plurality of first data lines, a plurality of second data lines, a plurality of pixel units and a plurality of control module. The first data lines are disposed and interlaced with the scan lines. The second data lines are disposed and interlaced with the scan lines. Each of the pixel units is coupled to one scan line and one first data line respectively. Each of the control modules is coupled among the scan line, one second data line and one pixel unit. The second data line charges the later control module when the scan line is selected to be activated for charging the pixel unit by the first data line. The charged later control module charges another pixel unit when the scan line is inactivated and another scan line is selected to be activated for charging another pixel unit by the first data line.

In one embodiment, the later control module further includes a first control transistor, a second control transistor and a capacitor. The first control transistor is coupled to the scan line, the second data line, the pixel unit and a former control module corresponding to the later control module. The second control transistor is coupled to another scan line and another pixel unit. The capacitor is coupled to the first control transistor and the second control transistor of the later control module.

In one embodiment, the second data line and the first control transistor charge the capacitor of the later control module when the scan line is selected to be activated for charging the pixel unit by the first data line. The charged capacitor of the later control module charges another pixel unit when the scan line is inactivated and another scan line is selected to be activated for charging another pixel unit by the first data line.

In one embodiment, the former control module further includes a first control transistor, a second control transistor and a capacitor. The second control transistor is coupled to the scan line, the pixel unit and the gate electrode of the first control transistor in the later control module. The capacitor is coupled to the second control transistor.

In one embodiment, the pixel unit further includes a switching transistor, a liquid-crystal capacitor and a storage capacitor. The switching transistor is coupled to the scan line, the first data line, the second control transistor of the former control module, and the gate electrode of the first control transistor of the later control module. The liquid-crystal capacitor is coupled to the switching transistor. The storage capacitor is coupled to the switching transistor and connected to the liquid-crystal capacitor in parallel manner.

The TFT array structure and LCD panel of the present invention utilize the control transistors for turning on or off the control transistors so that the charged capacitor in advance and two data lines are used to drive the pixel units for reducing the charging duration of the pixel units.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
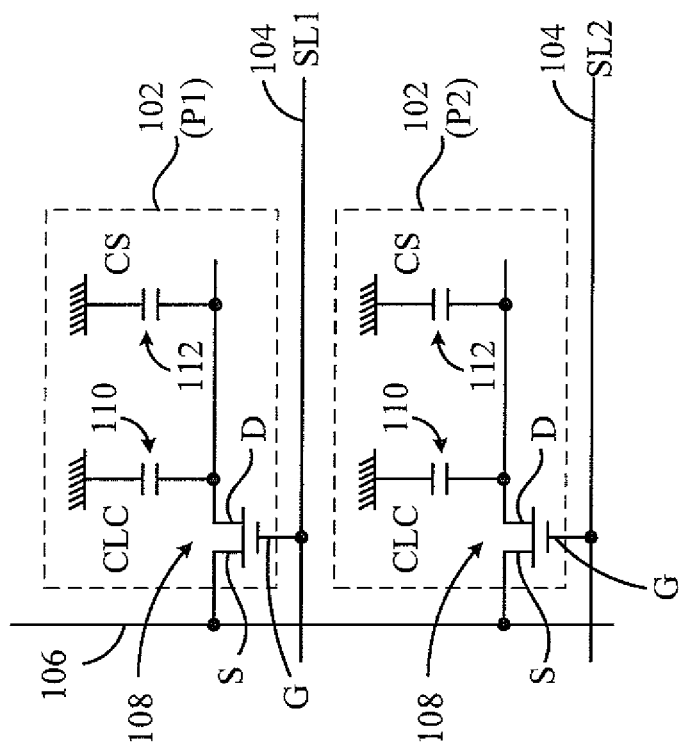
FIG. 1 is a schematic structural view of a conventional TFT array structure.
Figure 2:
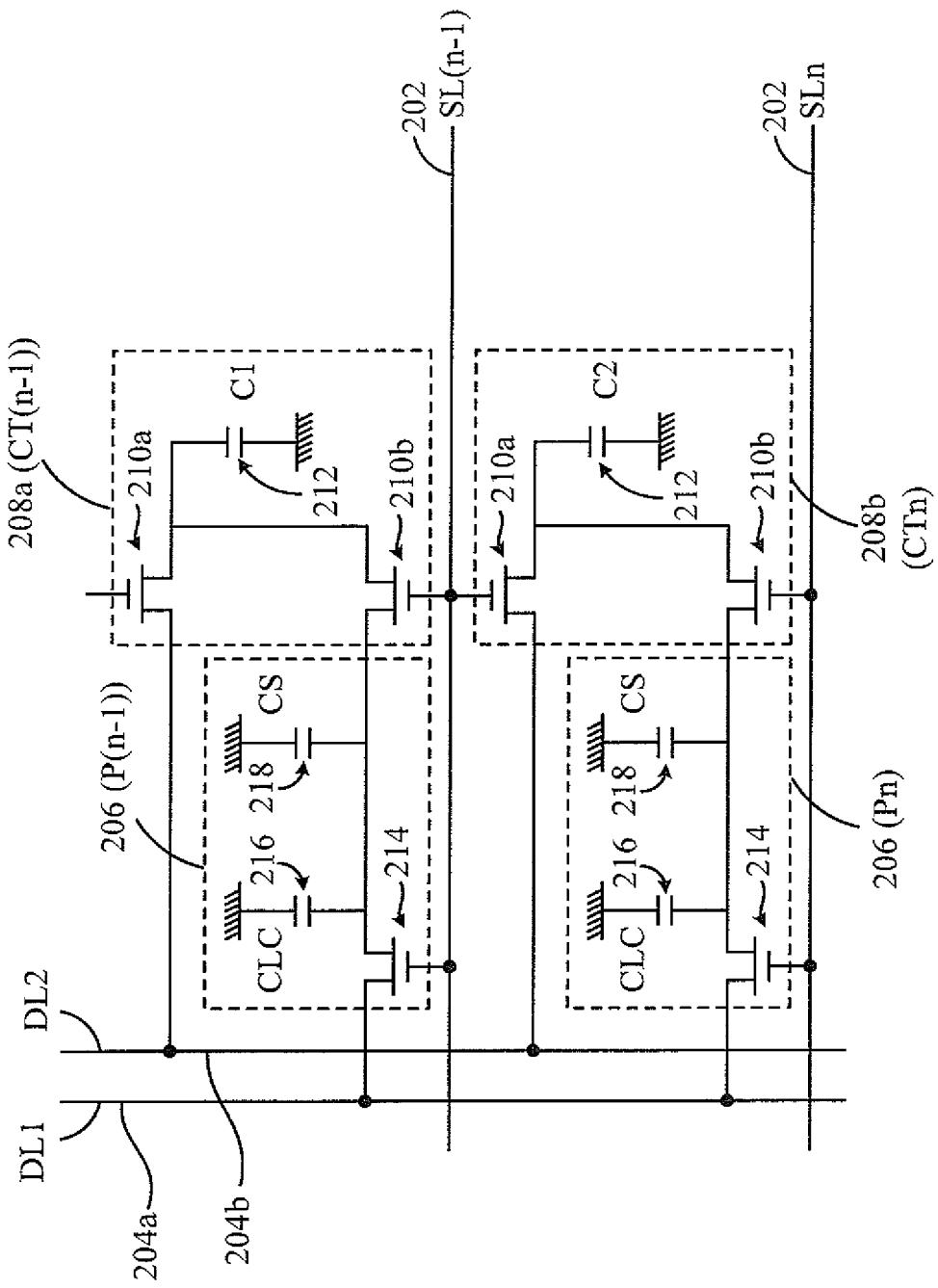
FIG. 2 is a schematic structural view of a TFT array structure according to one embodiment of the present invention.

FIG. 2 is a schematic structural view of a thin-film transistor (TFT) array structure 200 according to one embodiment of the present invention. The TFT array 200 includes a plurality of scan lines 202, a plurality of first data lines 204a, a plurality of second data lines 204b, a plurality of pixel units 206 and a plurality of control modules 208. The scan lines 202 are disposed and interlaced with the first data lines 204a and the second data lines 204b. For example, two scan lines SL(n−1), SLn 202 are disposed and interlaced with a data line DL1 204a and a second data line DL2 204b. Two pixel units P(n−1), Pn 206 and two control modules CT(n−1), CTn 208 are exemplarily depicted, but not limited.

Each of the pixel units P(n−1), Pn 206 is coupled to one scan line 202, one first data line 204a and the control module 208 respectively. The pixel units P(n−1), Pn 206 are disposed in the scan lines SL(n−1), SLn 202 near the interlaced position of the first data line DL1 204a and the second data line DL2 204b.

The control modules 208a, 208b are disposed between the pixel units P(n−1), Pn 206. The control module 208a is coupled among the scan line SL(n−1) 202, one second data line 204b and one pixel unit P(n−1) 206. The control module 208b is coupled among another scan line SLn 202, the second data line 204b and another pixel unit Pn 206. The second data line DL2 204b charges the later control module 208b when the scan line SL(n−1) 202 is selected to be activated for charging the pixel unit Pn 206 by the first data line DL1 204a. The charged later control module 208b charges another pixel unit Pn 206 when the scan line SL(n−1) 202 is inactivated and another scan line SLn 202 is selected to be activated for charging another pixel unit Pn 206 by the first data line DL1 204a.

The later control module 208b further includes a first control transistor 210a, a second control transistor 210b and a capacitor 212. The first control transistor 210a is coupled to the scan line SL(n−1) 202, the second data line DL2 204b, the pixel unit P(n−1) 206 and a former control module 208a corresponding to the later control module 208b. The second control transistor 210b is coupled to another scan line SLn 202 and another pixel unit Pn 206. The capacitor 212 is coupled to the first control transistor 210a and the second control transistor 210b of the later control module 208b. The second data line DL2 204b and the first control transistor 210a of the later control module 208b charge the capacitor 212 of the later control module 208b when the scan line SL(n−1) 202 is selected to be activated for charging the pixel unit P(n−1) 206 by the first data line DL1 204a. The charged capacitor 212 of the later control module 208b charges another pixel unit Pn 206 when the scan line SL(n−1) 202 is inactivated and another scan line SLn 202 is selected to be activated for charging another pixel unit Pn 206 by the first data line DL1 204a.

The former control module 208a is similar to the later control module 208b. The former control module 208a further includes a first control transistor 210a, a second control transistor 210b and a capacitor 212. The second control transistor 210b is coupled to the scan line SL(n−1) 202, the pixel unit P(n−1) 206 and the gate electrode of the first control transistor 210a in the later control module 208b respectively. The capacitor 212 is coupled to the second control transistor 210b.

According to the above-mentioned descriptions, when the TFT array structure 200 operates, two data lines 204a, 204b disposed between two pixel units 206 are employed wherein the data line 204a is capable of charging the two pixel units 206, i.e. transmitting the video signal, and the data line 204b can charge the capacitor 212 in advance. Specifically, a predetermined voltage (e.g. positive voltage) is applied to the scan line SL(n−1) 202 for turning on the switching transistor 214 of the pixel unit P(n−1) 206 to charge the pixel unit P(n−1) 206. Further, the first control transistor 210b of the control module 208a turns on for transmitting the video signal to the later control module 208b via the second data line DL2 204b so that the capacitor 212 of the later control module 208b is charged beforehand via the first control transistor 210a of the later control module 208b.

Afterwards, another predetermined voltage (e.g. negative voltage) is applied to the scan line SL(n−1) 202 for turning off the switching transistor 214 of the pixel unit P(n−1) 206, the second control transistor 210b of the former control module 208a, and the first control transistor 210a of the later control module 208b. That is, the transistors connected to the scan line SL(n−1) 202 turn off. The predetermined voltage is applied to another scan line SLn 202 for turning on the switching transistor 214 of the pixel unit Pn 206 to charge the pixel unit Pn 206. Simultaneously, the charged capacitor 212 of the later control module 208b is capable of charging the pixel unit Pn 206. Thus, the pixel unit Pn 206 is charged rapidly to improve the conventional long charging duration. In other words, while turning on the transistor 214, the charged capacitor 212 of the later control module 208b can charge the pixel unit Pn 206 beforehand besides the pixel unit Pn 206 is charged by the first data line DL1 204 for the purpose of rapid charging to effectively reduce the charging duration.

The pixel unit P(n−1) 206 further includes a switching transistor 214, a liquid-crystal capacitor (CLC) 216 and a storage capacitor (CS) 218. The switching transistor 214 is coupled to the scan line SL(n−1) 202, the first data line DL1 204a, the second control transistor 210b of the former control module 208a, and the gate electrode of the first control transistor 210a of the later control module 208b. The liquid-crystal capacitor 216 is coupled to the drain electrode of the switching transistor 214 and the source electrode of the second control transistor 210b in the former control module 208a. The storage capacitor 218 is coupled to the drain source of the switching transistor 214 and the source electrode of the second control transistor 210b in the former control module 208a. The storage capacitor 218 is further connected to the liquid-crystal capacitor in parallel manner.

The pixel unit Pn 206 is the same as the pixel unit P(n−1) 206. The pixel unit Pn 206 further includes a switching transistor 214, a liquid-crystal capacitor (CLC) 216 and a storage capacitor (CS) 218. The switching transistor 214 is coupled to the scan line SLn 202, the first data line DL1 204a, and the second control transistor 210b of the former control module 208a. The liquid-crystal capacitor 216 is coupled to the drain electrode of the switching transistor 214 and the source electrode of the second control transistor 210b in the former control module 208a. The storage capacitor 218 is coupled to the drain source of the switching transistor 214 and the source electrode of the second control transistor 210b in the former control module 208a. The storage capacitor 218 is further connected to the liquid-crystal capacitor in parallel manner.

Figure 3:
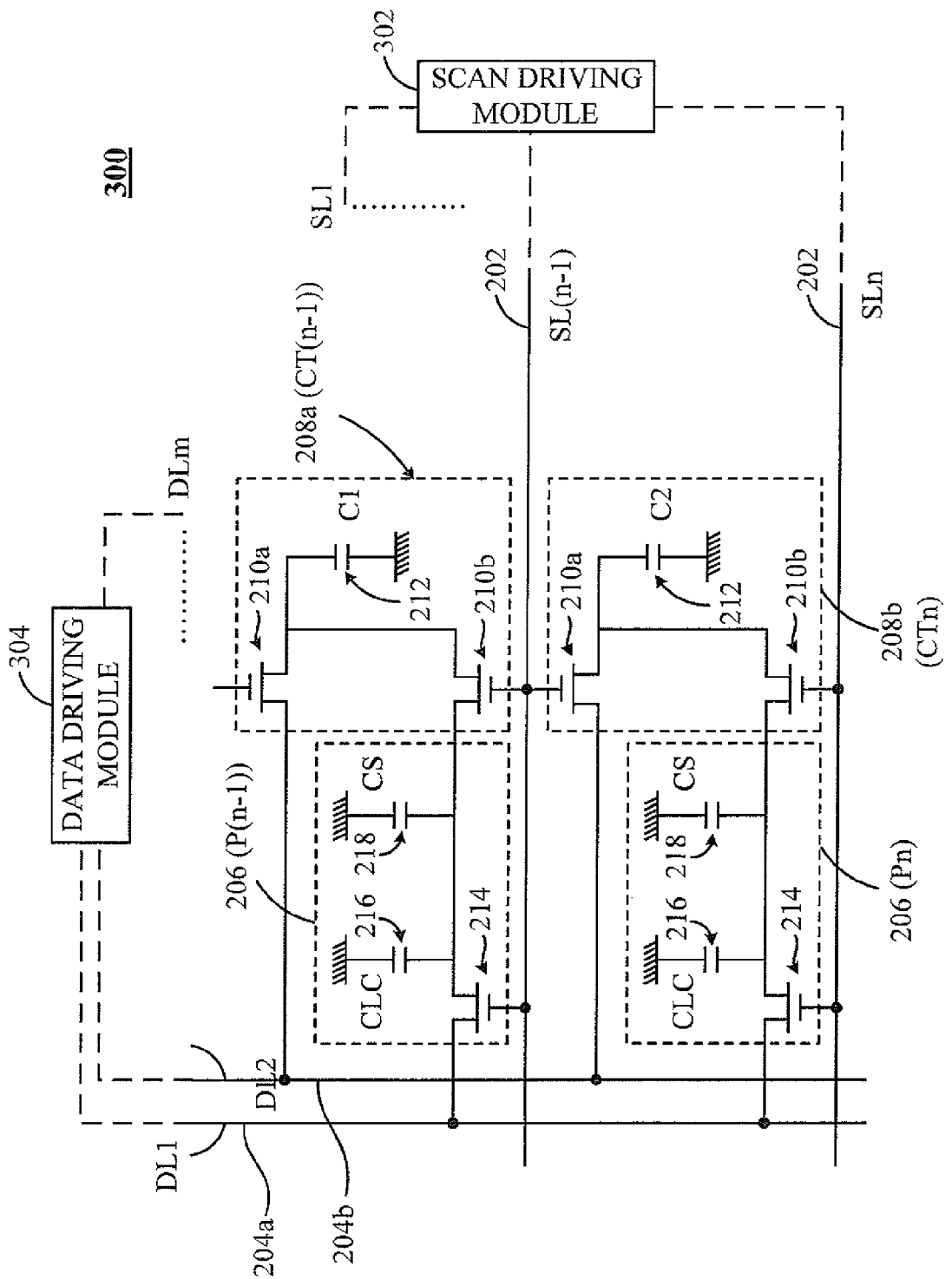
FIG. 3 is a schematic structural view of LCD panel with the TFT array structure shown in FIG. 2 according to one embodiment of the present invention.

Please refer to FIG. 2 and FIG. 3. FIG. 3 is a schematic structural view of LCD panel 300 with the TFT array structure 200 shown in FIG. 2 according to one embodiment of the present invention. The LCD panel 300 has a scan driving module 302, a data driving module 304, and a TFT array structure 200 wherein the scan driving module 302 and the data driving module 304 are used to drive the TFT array structure 200. That is, the scan driving module 302 applies the predetermined voltage to the scan lines 202 for either turning on or turning off the switching transistors 214 and the first control transistor 210a and the second control transistor 210b of the control module connected to the scan line 202. The data driving module 304 transmits the video signal to the pixel units Pn, P(n−1) 206 for charging the CLCs corresponding to the pixel units Pn, P(n−1) 206 to drive the liquid crystal molecules within the liquid crystal layer for displaying the image on the LCD panel.

The TFT array 200 includes a plurality of scan lines 202, a plurality of first data lines 204a, a plurality of second data lines 204b, a plurality of pixel units 206 and a plurality of control modules 208. The scan lines 202 are disposed and interlaced with the first data lines 204a and the second data lines 204b. For example, two scan lines SL(n−1), SLn 202 are disposed and interlaced with a data line DL1 204a and a second data line DL2 204b. Two pixel units P(n−1), Pn 206 and two control modules CT(n−1), CTn 208 are exemplarily depicted, but not limited.

Each of the pixel units P(n−1), Pn 206 is coupled to one scan line 202, one first data line 204a and the control module 208 respectively. The pixel units P(n−1), Pn 206 are disposed in the scan lines SL(n−1), SLn 202 near the interlaced position of the first data line DL1 204a and the second data line DL2 204b.

The control modules 208a, 208b are disposed between the pixel units P(n−1), Pn 206. The control module 208a is coupled among the scan line SL(n−1) 202, one second data line 204b and one pixel unit P(n−1) 206. The control module 208b is coupled among another scan line SLn 202, the second data line 204b and another pixel unit Pn 206. The second data line DL2 204b charges the later control module 208b when the scan line SL(n−1) 202 is selected to be activated for charging the pixel unit Pn 206 by the first data line DL1 204a. The charged later control module 208b charges another pixel unit Pn 206 when the scan line SL(n−1) 202 is inactivated and another scan line SLn 202 is selected to be activated for charging another pixel unit Pn 206 by the first data line DL1 204a.

Based on the above descriptions, the present invention utilizes at least two data lines disposed in at least two pixel units therebetween to reduce the charging duration of the pixel units wherein one data line is capable of charging the two pixel units, i.e. transmitting the video signal, and another data line can charge the capacitor in advance. That is, for the purpose of rapid charging to effectively reduce the charging duration, the charged capacitor of the later control module can charge the pixel unit besides the pixel unit is charged by the first data line.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A thin-film transistor (TFT) array structure, comprising:
   a plurality of scan lines;
   a plurality of first data lines, disposed and interlaced with the scan lines;
   a plurality of second data lines, disposed and interlaced with the scan lines;
   a plurality of pixel units, wherein each of the pixel units coupled to one scan line and one first data line respectively; and
   a plurality of control modules, wherein each of the control modules is coupled among the scan line, one second data line and one pixel unit, the second data line charges the later control module when the scan line is selected to be activated for charging the pixel unit by the first data line, and the charged later control module charges another pixel unit when the scan line is inactivated and another scan line is selected to be activated for charging another pixel unit by the first data line.

2. The TFT array structure of claim 1, wherein the later control module further comprises:
   a first control transistor coupled to the scan line, the second data line, the pixel unit and a former control module corresponding to the later control module;
   a second control transistor coupled to the another scan line and the another pixel unit; and a capacitor coupled to the first control transistor and the second control transistor of the later control module.

3. The TFT array structure of claim 2, wherein the second data line and the first control transistor charge the capacitor of the later control module when the scan line is selected to be activated for charging the pixel unit by the first data line, and the charged capacitor of the later control module charges another pixel unit when the scan line is inactivated and another scan line is selected to be activated for charging another pixel unit by the first data line.

4. The TFT array structure of claim 2, wherein the former control module further comprises:
   a first control transistor;
   a second control transistor coupled to the scan line, the pixel unit and the gate electrode of the first control transistor in the later control module; and
   a capacitor coupled to the second control transistor.

5. The TFT array structure of claim 4, wherein the pixel unit further comprises:
   a switching transistor coupled to the scan line, the first data line, the second control transistor of the former control module, and the gate electrode of the first control transistor of the later control module;
   a liquid-crystal capacitor coupled to the switching transistor; and
   a storage capacitor coupled to the switching transistor and connected to the liquid-crystal capacitor in parallel manner.

6. A liquid crystal display (LCD) panel having a scan driving module, a data driving module, and a TFT array structure wherein the scan driving module and the data driving module are used to drive the TFT array structure, the TFT array structure comprising:
   a plurality of scan lines;
   a plurality of first data lines, disposed and interlaced with the scan lines;
   a plurality of second data lines, disposed and interlaced with the scan lines;
   a plurality of pixel units, wherein each of the pixel units coupled to one scan line and one first data line; and
   a plurality of control modules, wherein each of the control modules is coupled among the scan line, one second data line and one pixel unit, the second data line charges the later control module when the scan line is selected to be activated for charging the pixel unit by the first data line, and the charged later control module charges another pixel unit when the scan line is inactivated and another scan line is selected to be activated for charging another pixel unit by the first data line.

7. The LCD panel of claim 6, wherein the later control module further comprises:
   a first control transistor coupled to the scan line, the second data line, the pixel unit and a former control module corresponding to the later control module;
   a second control transistor coupled to the another scan line and the another pixel unit; and
   a capacitor coupled to the first control transistor and the second control transistor of the later control module.

8. The LCD panel of claim 7, wherein the second data line and the first control transistor charge the capacitor of the later control module when the scan line is selected to be activated for charging the pixel unit by the first data line, and the charged capacitor of the later control module charges another pixel unit when the scan line is inactivated and another scan line is selected to be activated for charging another pixel unit by the first data line.

9. The LCD panel of claim 7, wherein the former control module further comprises:
   a first control transistor;
   a second control transistor coupled to the scan line, the pixel unit and the gate electrode of the first control transistor in the later control module; and
   a capacitor coupled to the second control transistor.

10. The LCD panel of claim 9, wherein the pixel unit further comprises:
    a switching transistor coupled to the scan line, the first data line, the second control transistor of the former control module, and the gate electrode of the first control transistor of the later control module;
    a liquid-crystal capacitor coupled to the switching transistor; and
    a storage capacitor coupled to the switching transistor and connected to the liquid-crystal capacitor in parallel manner.

* * * * *